(12) United States Patent
Kao

(10) Patent No.: US 7,842,984 B2
(45) Date of Patent: Nov. 30, 2010

(54) CMOS IMAGE SENSOR

(75) Inventor: Ching-Hung Kao, Hsinchu Hsien (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 251 days.

(21) Appl. No.: 12/270,684

(22) Filed: Nov. 13, 2008

(65) Prior Publication Data

US 2009/0065833 A1    Mar. 12, 2009

Related U.S. Application Data

(62) Division of application No. 11/565,849, filed on Dec. 1, 2006, now Pat. No. 7,470,945.

(51) Int. Cl.
*H01L 31/062* (2006.01)
*H01L 31/113* (2006.01)

(52) U.S. Cl. .............. 257/290; 257/291; 257/292; 257/E27.133

(58) Field of Classification Search ......... 257/290–292, 257/E27.133
See application file for complete search history.

(56) References Cited

U.S. PATENT DOCUMENTS

| | | | |
|---|---|---|---|
| 6,690,423 B1 * | 2/2004 | Nakamura et al. ......... | 348/311 |
| 7,102,184 B2 | 9/2006 | Rhodes | |
| 2005/0023580 A1 * | 2/2005 | Rhodes ......................... | 257/292 |
| 2005/0051701 A1 | 3/2005 | Hong ........................ | 250/214.1 |
| 2006/0118836 A1 | 6/2006 | Rhodes | |

FOREIGN PATENT DOCUMENTS

TW    200541091    12/2005

* cited by examiner

*Primary Examiner*—Bradley K Smith
*Assistant Examiner*—Alexander Belousov
(74) *Attorney, Agent, or Firm*—Winston Hsu; Scott Margo

(57) ABSTRACT

A CMOS image sensor is described, based on a substrate and including a transfer transistor, a reset transistor, a source follower transistor, a select transistor, a photodiode and a floating node structure. The substrate includes a floating node area between the transfer transistor and the reset transistor. The floating node structure includes a P-well in the substrate within the floating node area, an N-well in the substrate outside of the floating node region, a lightly N-doped region having a portion in the P-well and another portion connected with the N-well, a heavily N-doped region in the N-well, and a contact plug for coupling the heavily N-doped region to the source follower transistor.

2 Claims, 3 Drawing Sheets

CMOS IMAGE SENSOR

CROSS-REFERENCE TO RELATED APPLICATION

This application is a divisional of an application Ser. No. 11/565,849, filed on Dec. 1, 2006, now allowed. The entirety of each of the above-mentioned patent applications is hereby incorporated by reference herein and made a part of this specification.

BACKGROUND OF THE INVENTION

1. Field of Invention

This invention relates to an image sensor, and more particularly to a structure of a complementary metal-oxide-semiconductor (CMOS) image sensor (CIS).

2. Description of Related Art

A CIS process is compatible with a CMOS process, so that CIS can be easily integrated with peripheral circuits on a single chip to lower the production cost and power consumption. Hence, CIS has recently replaced CCD in low-end applications and gets more and more important.

A CIS typically includes a photodiode and several transistors, wherein the photo-diode includes a PN junction formed by a P-substrate and an N-doped region therein, and the transistors are NMOS transistors. Current CIS structures can be classified into 3T-type (three-transistor) structures and 4T-type (four-transistor) structures.

A typical 3T-type structure includes a reset transistor, a source follower transistor, a select transistor and a photodiode. Such a structure causes high dark current, so that the noise is increased lowering the quality of the recorded image. Therefore, 4T-type structures are used more widely.

FIG. 1 schematically depicts a conventional 4T-type CMOS image sensor, which is based on a substrate 100 and includes a transfer transistor 102, a reset transistor 104, a source follower transistor 106, a select transistor 108, a PN-junction photodiode 110, a floating node 112 and a P-well 114. A 4T-type CIS structure causes lower dark current for including a transfer transistor 102.

In a 4T-type CIS structure, the floating node 112 is usually coupled to the gate of the source follower transistor 106 via a contact plug. However, since the floating node 112 is a heavily N-doped region, certain leakage occurs at the PN-junction between the floating node 112 and the P-well 114 lowering the image quality. The current leakage even gets larger as the temperature is raised.

SUMMARY OF THE INVENTION

Accordingly, this invention provides a CMOS image sensor, where the floating node as a heavily N-doped region is moved to an N-well so that less leakage is caused improving the quality of image recording.

The CMOS image sensor of this invention is based on a substrate and includes a transfer transistor, a reset transistor, a source follower transistor, a select transistor, a photodiode and a floating node structure, wherein the substrate includes a floating node area between the transfer transistor and the reset transistor. In an embodiment, the floating node structure includes a P-well in the substrate within the floating node area, an N-well in the substrate outside of the floating node area, a lightly N-doped region having a portion in the P-well and another portion extending out of the floating node area to connect with the N-well, a heavily N-doped region in the N-well, and a contact plug for coupling the heavily N-doped region to the source follower transistor.

In another embodiment, the floating node structure includes a P-well in the substrate within the floating node area, an N-well in the P-well, a heavily N-doped region in the N-well, and a contact plug for coupling the heavily N-doped region to the source follower transistor.

In the above embodiments, the substrate may be a P-type silicon substrate. The CMOS image sensor may further includes a P-doped region in the surface layer of the substrate in the floating node area.

Accordingly, in the CMOS image sensor of this invention, the heavily N-doped region connecting with the contact plug is located in an N-well outside of the floating node area or inside of the P-well, but does not forms a PN junction with the P-well. Hence, the leakage can be effectively reduced improving the quality of image recording.

In addition, when a P-doped region is further included in the surface layer of the substrate in the floating node area, the current leakage at the substrate surface is also reduced effectively.

In order to make the aforementioned and other objects, features and advantages of the present invention comprehensible, a preferred embodiment accompanied with figures is described in detail below.

DESCRIPTION OF EMBODIMENTS

This invention is further explained with the following embodiments, which are not intended to restrict the scope of this invention.

Figure 1:
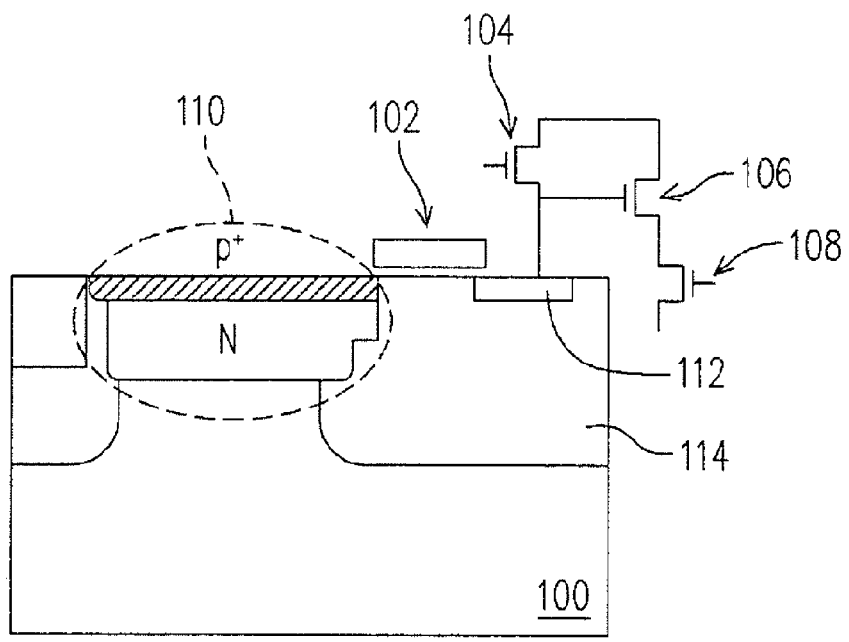
FIG. 1 schematically depicts a conventional 4T-type CMOS image sensor.
Figure 2:
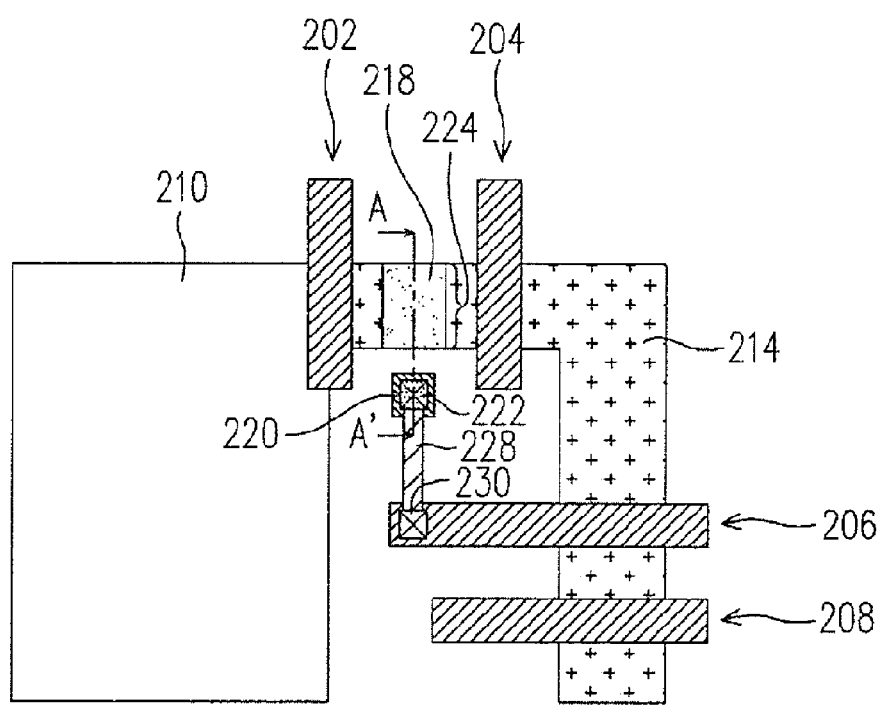
FIG. 2 depicts a top view of a CMOS image sensor according to an embodiment of this invention.
Figure 3:
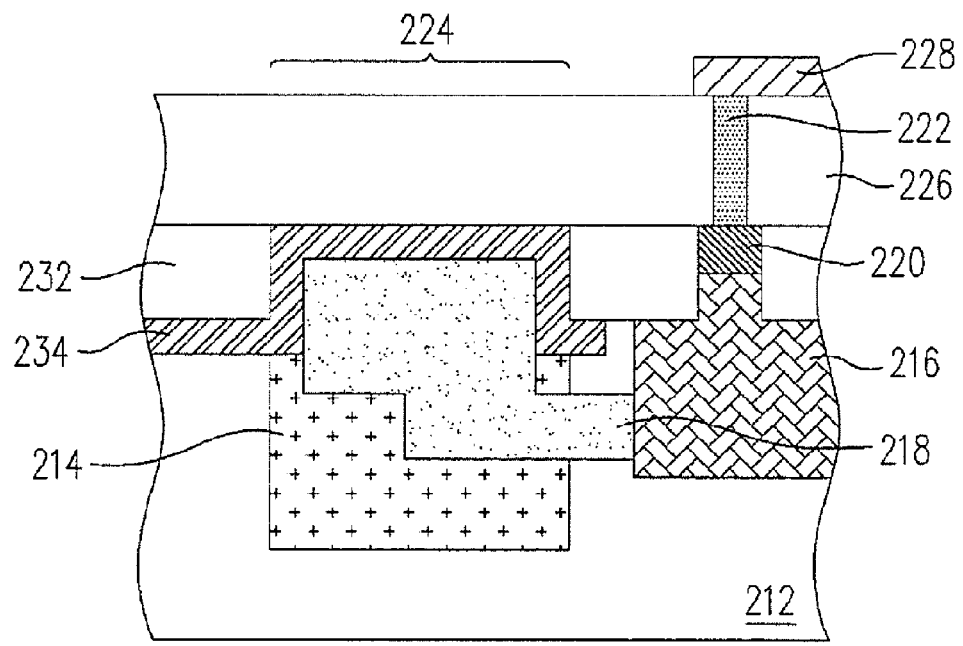
FIG. 3 depicts a cross-sectional view of the CMOS image sensor in FIG. 2 along the line A-A'.

FIG. 2 depicts a top view of a CMOS image sensor according to an embodiment of this invention, and FIG. 3 depicts a cross-sectional view of the same along the line A-A' in FIG. 2. Referring to FIGS. 2 and 3, the CMOS image sensor 200 is based on a substrate 212, including a transfer transistor 202, a reset transistor 204, a source follower transistor 206, a select transistor 208, a photodiode 210, and a floating node structure in FIG. 3. The substrate 212 includes a floating node area 224 between the transfer transistor 202 and the reset transistor 204, and may be a P-type Si-substrate.

The floating node structure includes a P-well 214, an N-well 216, a lightly N-doped region 218 and a heavily N-doped region 220 that are located in the substrate 212, and a contact plug 222.

The P-well 214 is located in the substrate 212 within the floating node area 224, possibly formed through implantation of boron or boron difluoride ion.

The N-well 216 is located in the substrate 212 outside of the floating node area 224, possibly formed through implantation of phosphorous or arsenic ion.

The lightly N-doped region 218 includes a portion in the P-well 214 and another portion extending out of the floating node area 224 to connect with the N-well 216, possibly formed through two phosphorous/arsenic ion-implantation steps respectively for forming the two portions.

The heavily N-doped region 220 is located in the N-well 216, possibly formed through implantation of phosphorous or arsenic ion.

The contact plug 222 is disposed in a dielectric layer 226 for coupling the heavily N-doped region 220 to the gate of the source follower transistor 206, possibly including heavily N-doped polysilicon. The contact plug 222 may be coupled to the gate of the transistor 206 via a conductive line 228 and a contact plug 230.

Moreover, a P-doped region 234 may be optionally disposed in the surface layer of the substrate 212 within the floating node area 224 and in the substrate 212 adjacent to the isolation structure 232, so as to reduce the leakage occurring at the surface of the substrate 212 and the periphery of the isolation structure 232.

In the CMOS image sensor of this embodiment, the heavily N-doped region 220 connecting with the contact plug 222 is located in an N-well 216 outside of the floating node area 224 not forming a PN junction with the P-well 214, so that the leakage can be effectively reduced improving the quality of image recording. In addition, when a P-doped region 234 is further included in the surface layer of the substrate 212 in the floating node area 224, the leakage at the substrate surface is also reduced effectively.

Figure 4:
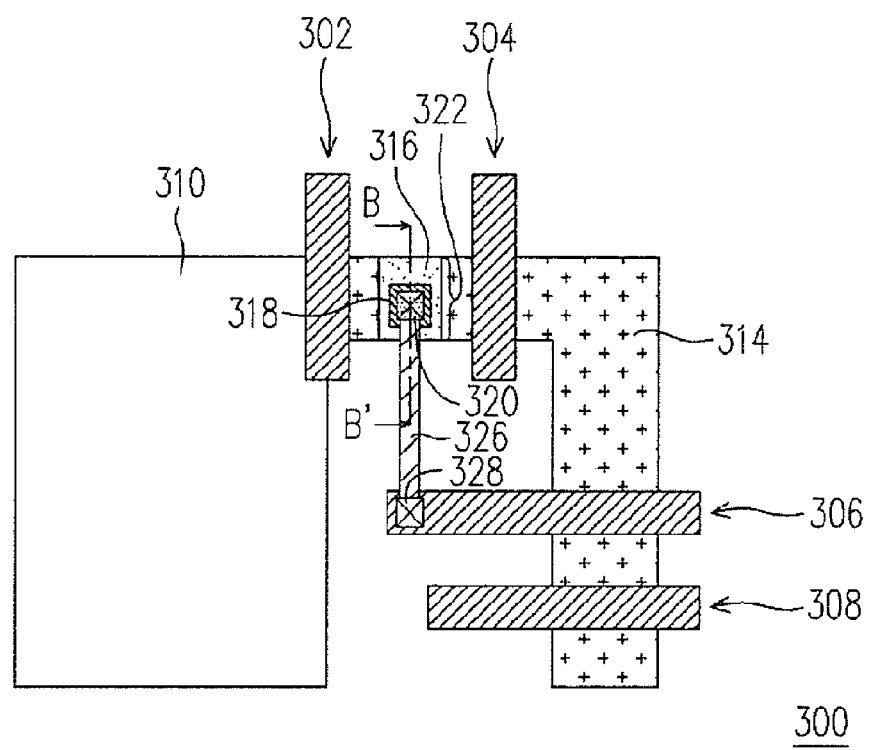
FIG. 4 depicts a top view of a CMOS image sensor according to another embodiment of this invention.
Figure 5:
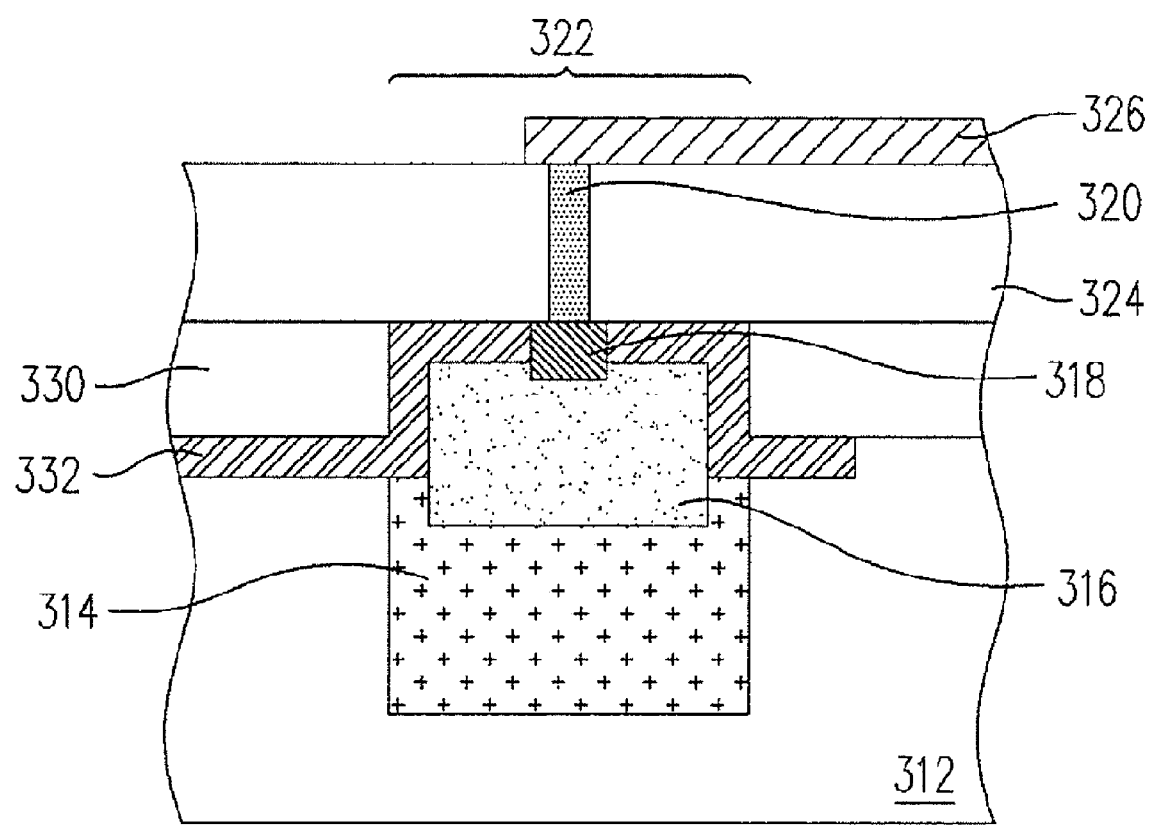
FIG. 5 depicts a cross-sectional view of the CMOS image sensor in FIG. 4 along the line B-B'.

FIG. 4 illustrates a top view of a CMOS image sensor according to another embodiment of this invention, and FIG. 5 illustrates a cross-sectional view of the same along the line B-B' in FIG. 4. Referring to FIGS. 4 and 5, the CMOS image sensor 300 is based on a substrate 312, including a transfer transistor 302, a reset transistor 304, a source follower transistor 306, a select transistor 308, a photodiode 310, and a floating node structure in FIG. 5. The substrate 312 includes a floating node area 322 between the transfer transistor 302 and the reset transistor 304, and may be a P-type Si-substrate.

The floating node structure includes a P-well 314, an N-well 316 and a heavily N-doped region 318 that are located in the substrate 312, and a contact plug 320.

The P-well 314 is located in the substrate 312 within the floating node area 322, possibly formed through implantation of boron or boron difluoride ion.

The N-well 316 is located in the P-well 314, possibly formed with implantation of phosphorous or arsenic ion.

The heavily N-doped region 318 is located in the N-well 316, possibly formed through implantation of phosphorous or arsenic ion.

The contact plug 320 is disposed in a dielectric layer 324 for coupling the heavily N-doped region 318 to the source follower transistor 306, possibly including heavily N-doped polysilicon. The contact plug 320 may be coupled to the source follower transistor 306 via a conductive line 326 and a contact plug 328.

Moreover, a P-doped region 332 may be optionally disposed in the surface layer of the substrate 312 within the floating node area 322 and in the substrate 312 adjacent to the isolation structure 330, so as to reduce the leakage occurring at the surface of the substrate 312 and the periphery of the isolation structure 330.

In the CMOS image sensor of this embodiment, the heavily N-doped region 318 connecting with the contact plug 320 is located in an N-well 316 in the P-well 314 not forming a PN junction with the P-well 314, so that the leakage is effectively reduced improving the quality of image recording. In addition, when a P-doped region 332 is further included in the surface layer of the substrate 312 in the floating node area 322, the leakage at the substrate surface is also reduced effectively.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A CMOS image sensor, based on a substrate and comprising a transfer transistor, a reset transistor, a source follower transistor, a select transistor, a photodiode and a floating node structure, wherein the substrate comprises a floating node area between the transfer transistor and the reset transistor, and the floating node structure comprises:
   a P-well in the substrate within the floating node area;
   an N-well in the P-well;
   a heavily N-doped region in the N-well; and
   a contact plug for coupling the heavily N-doped region to the source follower transistor, wherein the heavily N-doped region contacts a surface of the substrate; further comprising a P-doped region in a surface layer of the substrate in the floating node area.

2. The CMOS image sensor of claim 1, wherein the substrate comprises a P-type silicon substrate.

* * * * *